(12) United States Patent
Chi-Boon et al.

(10) Patent No.: US 8,552,979 B2
(45) Date of Patent: Oct. 8, 2013

(54) PROXIMITY SENSOR FOR A GRAPHICAL USER INTERFACE NAVIGATION BUTTON

(75) Inventors: Ong Chi-Boon, Sembawang Crescent (SG); Lim Sin-Heng, Bukit Batok (SG)

(73) Assignee: Avago Technologies General IP (Singapore) Pte. Ltd., Singapore (SG)

(*) Notice: Subject to any disclaimer, the term of this patent is extended or adjusted under 35 U.S.C. 154(b) by 2063 days.

(21) Appl. No.: 11/215,336

(22) Filed: Aug. 30, 2005

(65) Prior Publication Data

US 2007/0046629 A1 Mar. 1, 2007

(51) Int. Cl.
*G09G 5/08* (2006.01)
*G06F 3/033* (2013.01)

(52) U.S. Cl.
USPC .......................................... 345/158; 345/166

(58) Field of Classification Search
USPC ................... 345/156–184; 178/18.01–18.09, 178/18.11
See application file for complete search history.

(56) References Cited

U.S. PATENT DOCUMENTS

| | | | | |
|---|---|---|---|---|
| 4,736,097 A * | 4/1988 | Philipp | | 250/221 |
| 4,879,461 A * | 11/1989 | Philipp | | 250/221 |
| 5,355,148 A * | 10/1994 | Anderson | | 345/166 |
| 5,461,560 A * | 10/1995 | Uribe | | 700/83 |
| 6,552,713 B1 * | 4/2003 | Van Brocklin et al. | | 345/157 |
| 2002/0021278 A1 * | 2/2002 | Hinckley et al. | | 345/156 |
| 2002/0035701 A1 * | 3/2002 | Casebolt et al. | | 713/300 |
| 2002/0044132 A1 * | 4/2002 | Fish | | 345/156 |
| 2002/0167488 A1 * | 11/2002 | Hinckley et al. | | 345/156 |

* cited by examiner

*Primary Examiner* — Stephen Sherman

(57) ABSTRACT

A display device comprises a display screen, a graphical user interface navigation button and a proximity sensor including an infrared radiation emitter, an infrared radiation sensor and an infrared radiation source differentiator. The infrared radiation emitter emits a navigation infrared radiation. The infrared radiation sensor is positioned relative to the infrared radiation emitter to sense a reflection of the navigation infrared radiation in a navigation direction corresponding to the infrared radiation sensor. The infrared radiation source differentiator is in electrical communication with the infrared radiation sensor to provide a navigation mode signal indicative of at least one of a sensing by the infrared radiation sensor of a reflection of the navigation infrared radiation in the navigation direction corresponding to the infrared radiation sensor by a navigation object proximate the infrared radiation emitter and the infrared radiation sensor, and a sensing by the infrared radiation sensor of ambient infrared radiation emitted by an infrared radiation source other than the infrared radiation sensor.

21 Claims, 15 Drawing Sheets

| SCENARIO | SENSING MODE | AMBIENT LIGHT | SENSED IR PULSES | SENSED IR SUNLIGHT | SENSED IRDA PULSES | NAVIGATION MODE |
|---|---|---|---|---|---|---|
| 1 | OFF | N/A | 0 Amps | 0 Amps | 0 Amps | $V_{LL}$ |
| 2 | ON | NO | 2µA, 100µs, 2ms | 0 Amps | 0 Amps | $V_{LH}$-$V_{LL}$, 100µs, 2ms |
| 3 | ON | NO | 35µA, 100µs, 2ms | 0 Amps | 0 Amps | $V_{LH}$-$V_{LL}$, 100µs, 2ms |
| 4 | ON | YES | 0 Amps | 35µA | 0 Amps | $V_{LH}$-$V_{LL}$, $V_{LL}$ |
| 5 | ON | YES | 0 Amps | 35µA | 100µA, 1.6µs, 8.7ms | $V_{LH}$-$V_{LL}$, $V_{LL}$ |
| 6 | ON | NO | 0 Amps | 0 Amps | 100µA, 1.6µs, 8.7ms | $V_{LL}$ |

FIG. 7

PROXIMITY SENSOR FOR A GRAPHICAL USER INTERFACE NAVIGATION BUTTON

BACKGROUND OF THE INVENTION

Currently, most of the commercially available handphones use a stick-type navigation button to control and navigate a graphical user interface of the hand-phone as displayed on its display screen. This well known stick-type navigation button is a mechanical based mechanism that is subject to wear and tear in dependence upon the degree of force exerted on the stick-type navigation button by a user of the handphone. What is therefore needed is a new and unique navigation button for hand-phones and the like that is less sensitive to wear and tear by a user of the device.

SUMMARY OF THE INVENTION

The present invention provides a new and unique proximity sensor based navigation button that provides significant advantages over the mechanical stick-type navigation buttons known in the art.

In a first form of the present invention, a proximity sensor for facilitating an operation of a graphical user interface navigation button comprises an infrared radiation emitter, an infrared radiation sensor and an infrared radiation source differentiator. The infrared radiation emitter emits a navigation infrared radiation. The infrared radiation sensor is positioned relative to the infrared radiation emitter to sense a reflection of the navigation infrared radiation in a navigation direction corresponding to the infrared radiation sensor. The infrared radiation source differentiator is operable to provide a navigation mode signal indicative of at least one of a sensing by the infrared radiation sensor of a reflection of the navigation infrared radiation sensor in the navigation direction corresponding to the infrared radiation sensor by a navigation object proximate the infrared radiation emitter and the infrared, and a sensing by the infrared radiation sensor of ambient infrared radiation emitted by an infrared radiation source other than the infrared radiation sensor. An operation of the graphical user interface navigation button is facilitated by the proximity sensor in response to the navigation mode signal indicating at least a sensing by the infrared radiation sensor of the reflection of the navigation infrared radiation sensor in the navigation direction corresponding to the infrared radiation sensor by the navigation object.

In a second form of the present invention, a graphical user interface navigation system comprises a graphical user interface navigation button for facilitating a navigation of a graphical user interface and a proximity sensor for facilitating an operation of the graphical user interface navigation button. The proximity sensor includes an infrared radiation emitter, an infrared radiation sensor and an infrared radiation source differentiator. The infrared radiation emitter emits a navigation infrared radiation. The infrared radiation sensor is positioned relative to the infrared radiation emitter to sense a reflection of the navigation infrared radiation in a navigation direction corresponding to the infrared radiation sensor. The infrared radiation source differentiator is operable to provide a navigation mode signal indicative of at least one of a sensing by the infrared radiation sensor of a reflection of the navigation infrared radiation sensor in the navigation direction corresponding to the infrared radiation sensor by a navigation object proximate the infrared radiation emitter and the infrared radiation sensor, and a sensing by the infrared radiation sensor of ambient infrared radiation emitted by an infrared radiation source other than the infrared radiation sensor. An operation of the graphical user interface navigation button is facilitated by the proximity sensor in response to the navigation mode signal indicating at least a sensing by the infrared radiation sensor of the reflection of the navigation infrared radiation sensor in the navigation direction corresponding to the infrared radiation sensor by the navigation object.

A third form of the present invention is a display device comprising a display screen, a graphical user interface navigation button and a proximity sensor. The display screen displays a graphical user interface. The graphical user interface navigation button facilitates a navigation of the graphical user interface by a user of the display device. The proximity sensor facilitates an operation of the graphical user interface navigation button. The proximity sensor includes an infrared radiation emitter, an infrared radiation sensor and an infrared radiation source differentiator. The infrared radiation emitter emits a navigation infrared radiation. The infrared radiation sensor is positioned relative to the infrared radiation emitter to sense a reflection of the navigation infrared radiation in a navigation direction corresponding to the infrared radiation sensor. The infrared radiation source differentiator is operable to provide a navigation mode signal indicative of at least one of a sensing by the infrared radiation sensor of a reflection of the navigation infrared radiation sensor in the navigation direction corresponding to the infrared radiation sensor by a navigation object proximate the infrared radiation emitter and the infrared radiation sensor, and a sensing by the infrared radiation sensor of ambient infrared radiation emitted by an infrared radiation source other than the infrared radiation sensor. An operation of the graphical user interface navigation button is facilitated by the proximity sensor in response to the navigation mode signal indicating at least a sensing by the infrared radiation sensor of the reflection of the navigation infrared radiation sensor in the navigation direction corresponding to the infrared radiation sensor by the navigation object.

The aforementioned forms and other forms as well as objects and advantages of the present invention will become further apparent from the following detailed description of the various embodiments of the present invention read in conjunction with the accompanying drawings. The detailed description and drawings are merely illustrative of the invention rather than limiting, the scope of the present invention being defined by the appended claims and equivalents thereof.

BRIEF DESCRIPTION OF THE DRAWINGS

FIG. 7 illustrates a table listing various operational modes for the proximity sensor illustrated in FIG. 5;

DETAILED DESCRIPTION OF THE PRESENT INVENTION

Figure 1:
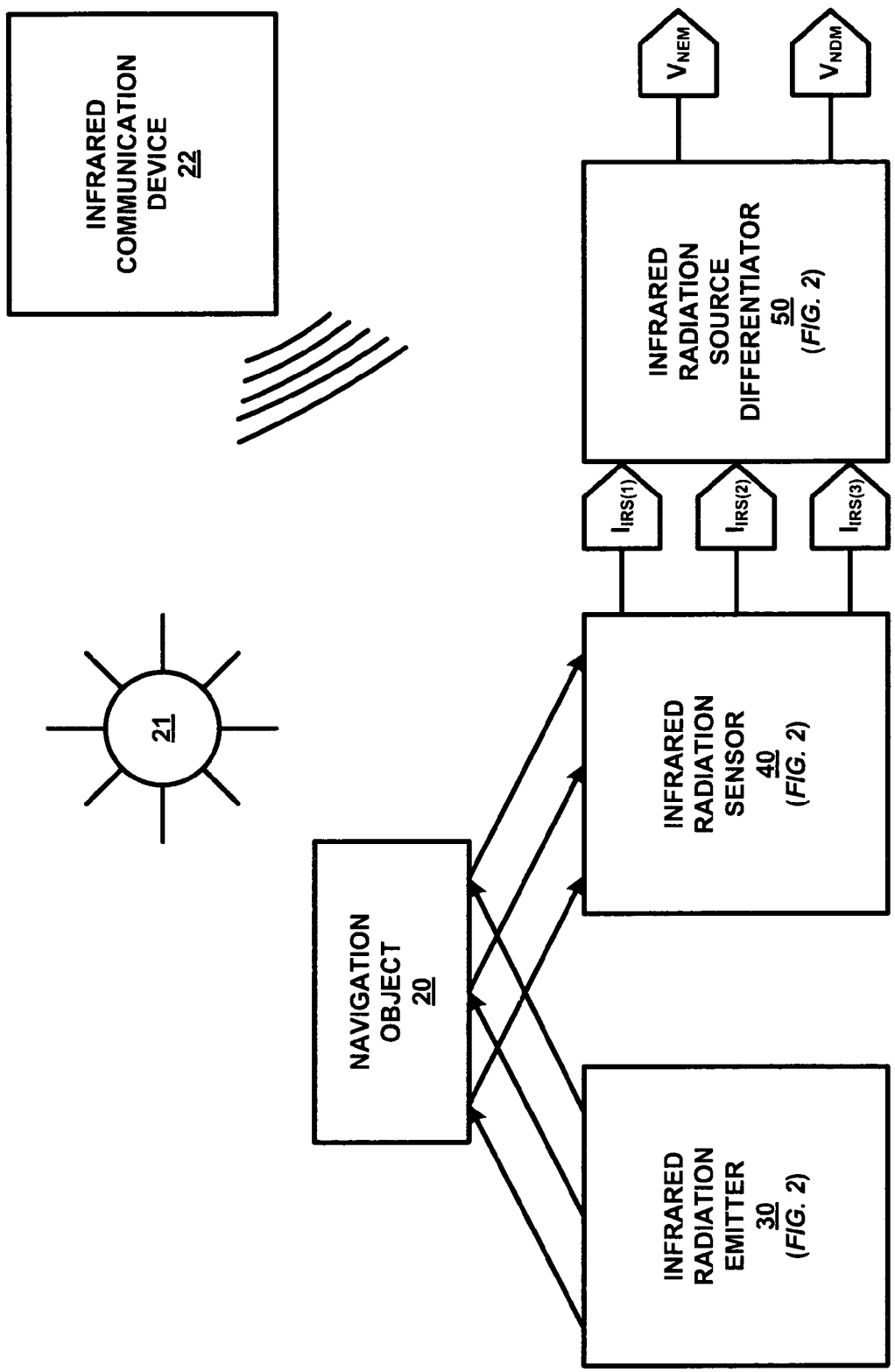
FIG. 1 illustrates a proximity sensor in accordance with the present invention.

FIG. 1 illustrates a proximity sensor of the present invention for facilitating a navigation via a graphical user interface navigation button of graphical user interfaces of various display devices including, but not limited to, a hand-held phone of any type. The proximity sensor employs an infrared radiation emitter 30 structurally configured to emit a navigation infrared radiation (e.g., a light emitting diode) and an infrared radiation sensor 40 structurally configured to be sensitive to the navigation infrared radiation (e.g., a photodiode). In operation, infrared radiation emitter 30 continuously or periodically emits a navigation infrared radiation whereby any reflection of the emitted navigation infrared radiation in a navigation direction corresponding to infrared radiation sensor 40 (e.g., up, down, left, right or some combination thereof) by a navigation object 20 proximate infrared radiation emitter 30 and infrared radiation sensor 40 (e.g., a thumb or a finger of a person trying to navigate a graphical user interface) is sensed by infrared radiation sensor 40, which emits an infrared sensing signal $I_{IRS(1)}$ indicative of a proximate degree of navigation object 20 to infrared radiation emitter 30 and infrared radiation sensor 40.

As would be appreciated by those having ordinary skill in the art, the infrared radiation sensitivity of infrared radiation sensor 40 facilitates a sensing of ambient infrared radiation within ambient light surrounding the proximity sensor from one or more infrared radiation sources other than infrared radiation emitter 30. For example, as shown in FIG. 1, a sun 21 emits infrared radiation within sunlight that can be ambient to infrared radiation sensor 40 during the daytime whereby infrared radiation sensor 40 will emit an infrared sensing signal $I_{IRS(2)}$ in response to sensing the ambient infrared radiation from sun 21. Also by example, as shown in FIG. 1, an infrared communication device 22 (e.g., a hand-held phone or a personal data assistant) can emit data in the form of infrared radiation that is directed toward infrared radiation sensor 40, intentionally or inadvertently, whereby infrared radiation sensor 40 will emit an infrared sensing signal $I_{IRS(3)}$ in response to sensing ambient infrared radiation from device 22. Thus, at any given moment, infrared radiation sensor 40 will be emitting one or more of the infrared signals $I_{IRS}$ in dependence upon the source(s) of infrared radiation being sensed by infrared radiation sensor 40.

To properly navigate a graphical user interface via the graphical user interface navigation button, it is essential that an emission by infrared radiation sensor 40 of infrared sensing signal $I_{IRS(1)}$ be differentiated from an emission by infrared radiation sensor 40 of infrared sensing signal $I_{IRS(2)}$ and an emission by infrared radiation sensor 40 of infrared sensing signal $I_{IRS(3)}$. To this end, the proximity sensor further employs a infrared radiation source differentiator 50 structurally configured to filter infrared sensing signals $I_{IRS(2)}$ and infrared sensing signal $I_{IRS(3)}$ to a suitable degree to thereby emit a navigation mode signal in the form of either a navigation enable mode signal $V_{NEM}$ or a navigation disable mode signal $V_{NDM}$ for respectively enabling or disabling a navigation of a graphical user interface via the graphical user interface navigation button.

In one embodiment of infrared radiation source differentiator 50, navigation enable mode signal $V_{NEM}$ is indicative of an exclusive emission by infrared radiation sensor 40 of infrared sensing signal $I_{IRS(1)}$, and navigation disable mode signal $V_{NDM}$ is indicative of an emission by infrared radiation sensor 40 of infrared sensing signal $I_{IRS(2)}$ and/or infrared sensing signal $I_{IRS(3)}$ inclusive or exclusive of an emission by infrared radiation sensor 40 of infrared sensing signal $I_{IRS(1)}$.

In an alternate embodiment of infrared radiation source differentiator 50, navigation enable mode signal $V_{NEM}$ is indicative of an emission by infrared radiation sensor 40 of infrared sensing signal $I_{IRS(1)}$ inclusive or exclusive of an emission by infrared radiation sensor 40 of infrared sensing signal $I_{IRS(2)}$ and/or infrared sensing signal $I_{IRS(3)}$, and navigation disable mode signal $V_{NDM}$ is indicative of an exclusive emission by infrared radiation sensor 40 of infrared sensing signal $I_{IRS(2)}$ and/or infrared sensing signal $I_{IRS(3)}$.

In practice, infrared radiation source differentiator 50 can also be structurally configured to emit navigation disable mode signal $V_{NDM}$ as being further indicative of emission by infrared radiation sensor 40 of an additional infrared sensing signal from any additional source of ambient infrared radiation. Also in practice, the structural configurations of infrared radiation emitter 30, infrared radiation sensor 40 and infrared radiation source differentiator 50 are dependent upon how the present invention is incorporated in a graphical user interface based display device. Thus, the following descriptions of one embodiment of infrared radiation emitter 30, infrared radiation sensor 40 and infrared radiation source differentiator 50 as shown in FIGS. 2-4 does not limit nor restrict the scope of structural configurations for infrared radiation emitter 30, infrared radiation sensor 40 and infrared radiation source differentiator 50 in accordance with the various inventive principles of the present invention.

Figure 2:
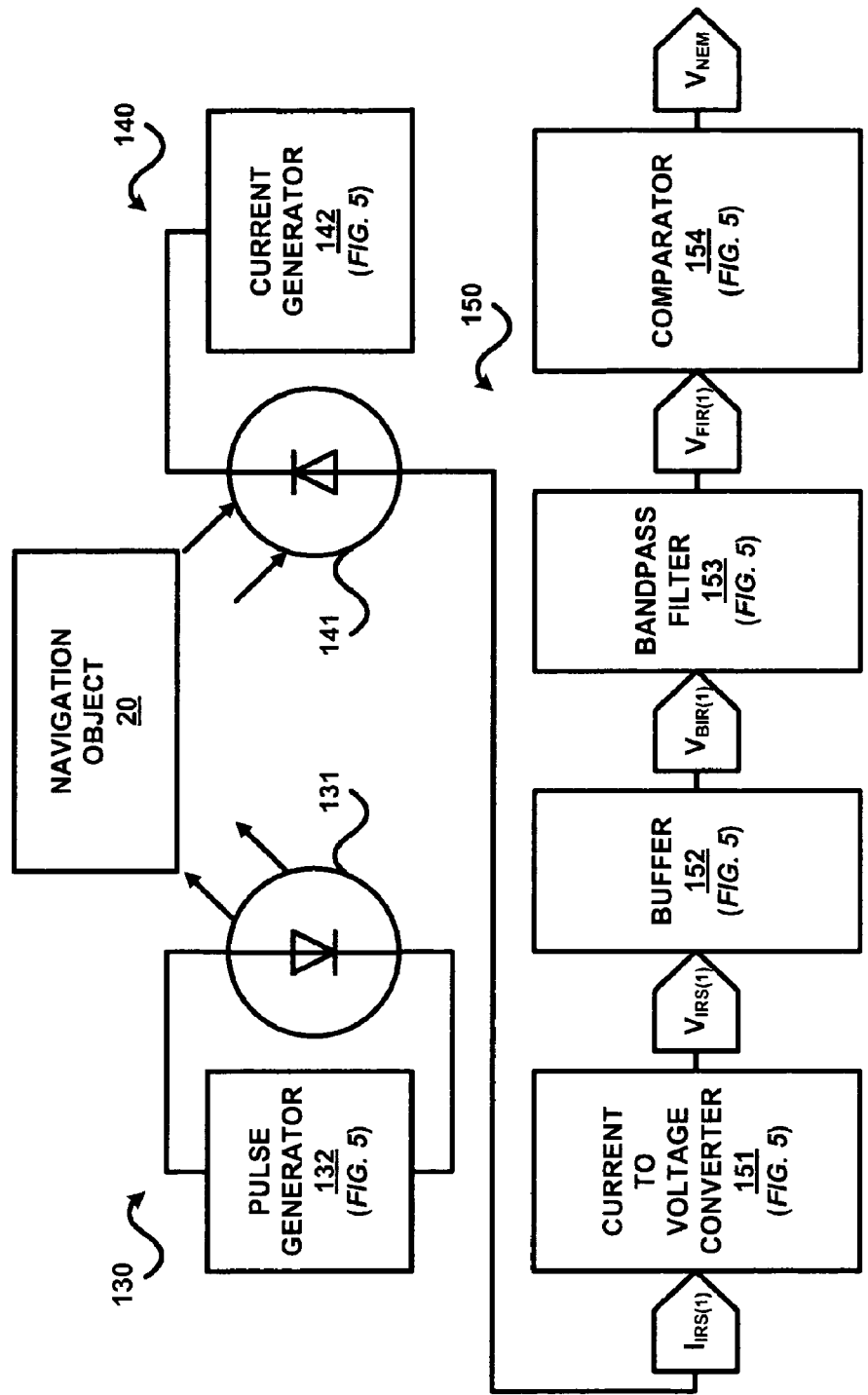
FIGS. 2-4 illustrate one embodiment in accordance with the present invention of the proximity sensor illustrated in FIG. 1.
Figure 3:
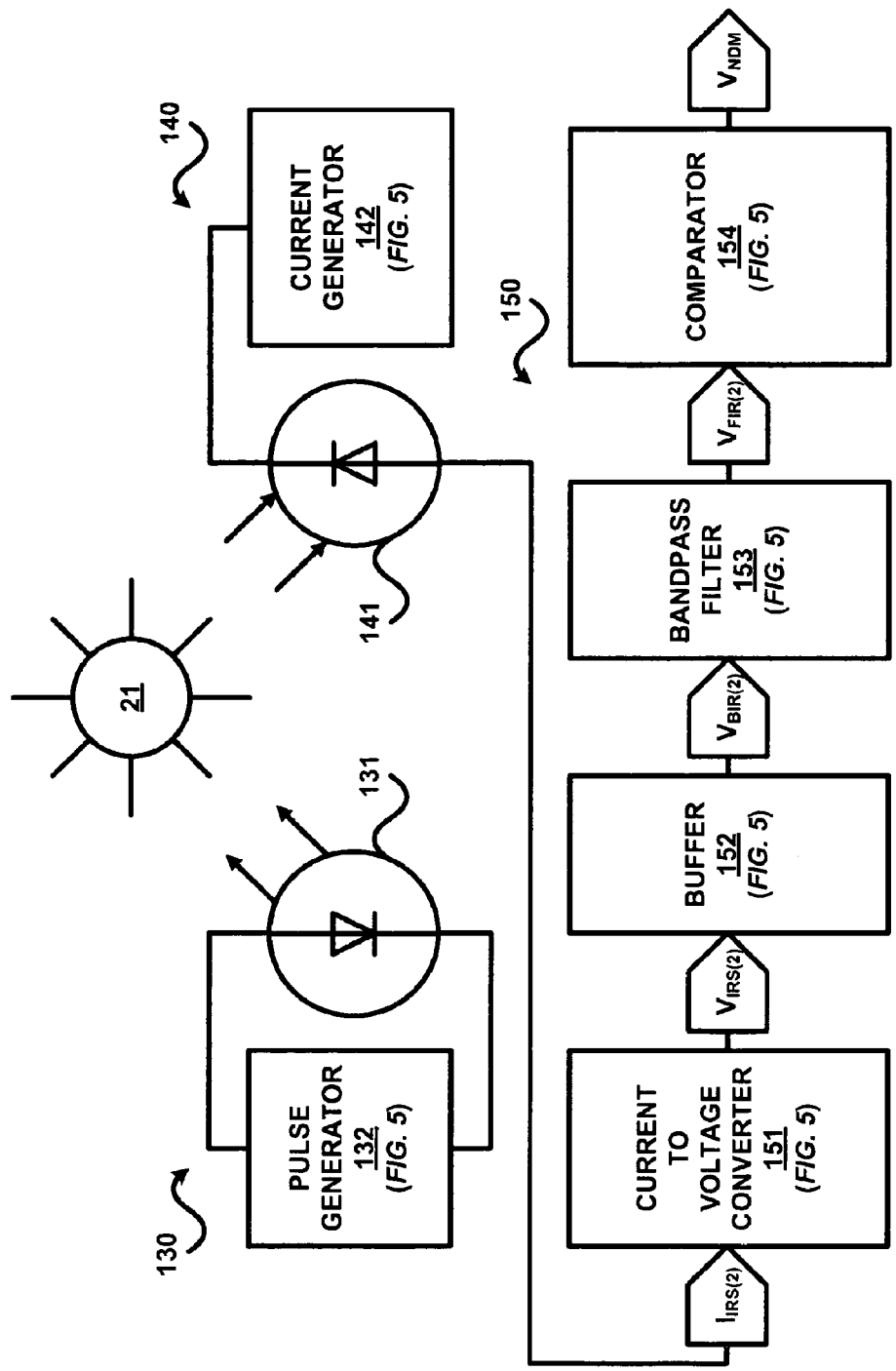
Figure 4:
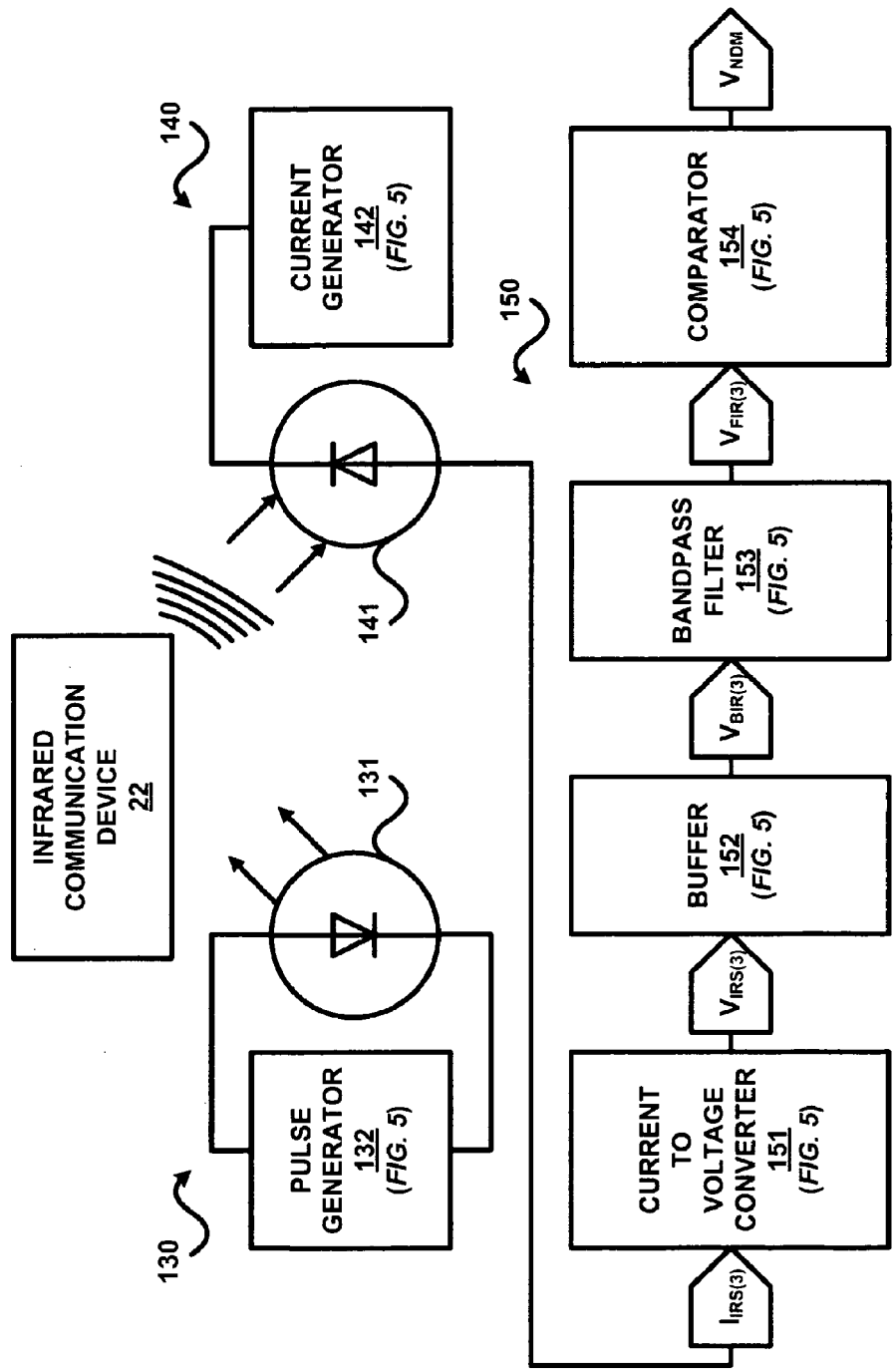

Referring to FIGS. 2-4, an embodiment 130 of infrared radiation emitter 30 (FIG. 1) includes a light emitting diode 131 and a pulse generator 132 operating light emitting diode 131 to emit pulses of navigation infrared radiation at a predefined infrared pulsing frequency. An embodiment of 41 of infrared radiation sensor 40 (FIG. 1) includes a photodiode 141 and a current generator 142 operating photodiode 141 to emit infrared sensing signal $I_{IRS}$ in dependence upon the source or sources of any infrared radiation sensed by photodiode 141.

An embodiment 150 of infrared radiation source differentiator 50 includes a current-to-voltage converter 151, a buffer 152, a bandpass filter 153 and a comparator 154. Current-to-voltage converter 151 receives and converts an emission of an infrared sensing signal $I_{IRS}$ from photodiode 141 into an infrared sensing signal $V_{IRS}$ that is buffered by buffer 152. Buffered infrared sensing signal $V_{BIR}$ is filtered by bandpass filter 153 to yield a filtered infrared sensing signal $V_{FIR}$ that is compared to a reference threshold of comparator 154. The comparison of the filtered infrared sensing signal $V_{FIR}$ to the reference threshold results in an enabling of a navigation mode of a graphical user interface navigation button via navigation enabling mode signal $V_{NEM}$ or a disabling of a navigation mode of a graphical user interface navigation button via navigation enabling mode signal $V_{NDM}$.

Specifically, as shown in FIG. 2, a conversion factor of converter 151, cut-off frequencies of bandpass filter 153 and the reference threshold of comparator 154 are designed to yield an emission of navigation enabling mode signal $V_{NEM}$ by comparator 154 in response to a sensing by photodiode 141 of the navigation infrared radiation pulses emitted by light emitting diode 131 as reflected by navigation object 20. Conversely, as shown in FIG. 3, the conversion factor of converter 151, the cut-off frequencies of bandpass filter 153 and the reference threshold of comparator 154 are designed to yield an emission of navigation disabling mode signal $V_{NDM}$ by comparator 154 in response to a sensing by photodiode 141 of the ambient infrared radiation within sunlight from sun 21.

Similarly, as shown in FIG. 4, the conversion factor of converter 151, the cut-off frequencies of bandpass filter 153 and the reference threshold of comparator 154 are designed to yield an emission of navigation disabling mode signal $V_{NDM}$ by comparator 154 in response to a sensing by photodiode 141 of the ambient infrared radiation data pulses from device 22. Additionally, the conversion factor of converter 151, the cut-off frequencies of bandpass filter 153 and the reference threshold of comparator 154 can be designed to yield an emission of navigation disabling mode signal $V_{NDM}$ by comparator 154 in response to a sensing by photodiode 141 of any other emission source of ambient infrared radiation as would be appreciated by those having ordinary skill in the art.

In practice, the structural configurations of infrared radiation emitter 130, infrared radiation sensor 140 and infrared radiation source differentiator 150 are dependent upon how the present invention is incorporated in a graphical user interface based display device. Thus, the following descriptions of one embodiment of infrared radiation emitter 130, infrared radiation sensor 140 and infrared radiation source differentiator 150 as shown in FIG. 5 does not limit or restrict the scope of structural configurations for infrared radiation emitter 130, infrared radiation sensor 140 and infrared radiation source differentiator 150 in accordance with the various inventive principles of the present invention.

Figure 5:
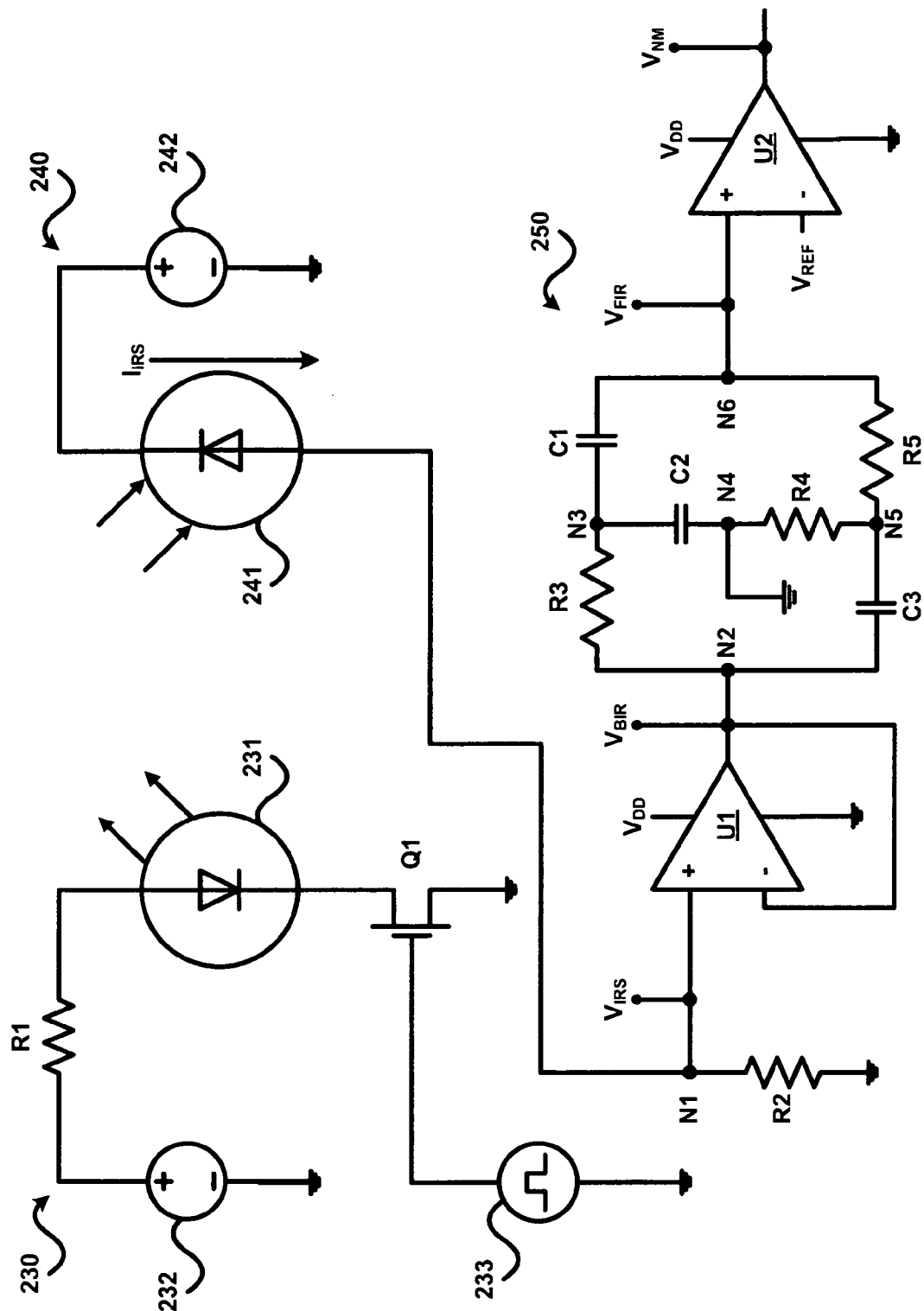
FIG. 5 illustrates one embodiment in accordance with the present invention of the proximity sensor illustrated in FIGS. 2-4.

Referring to FIG. 5, an embodiment 230 of infrared radiation emitter 130 (FIGS. 2-4) includes a voltage source 232 and a resistor R1 for applying a voltage to a light emitting diode 231, and a voltage pulsing source 233 and a transistor Q1 for operating light emitting diode 231 to emit navigation infrared radiation pulses at a pulsing frequency of pulsing source 233.

An embodiment 240 of infrared radiation sensor 140 (FIGS. 2-4) includes a photodiode 241 and a voltage biasing source 242 for operating photodiode 241 to facilitate a flow of an infrared sensing current $I_{IRS}$ from source 242 through photodiode 241 to a node N1 in response to a sensing of an infrared radiation by photodiode 241.

An embodiment 250 of infrared radiation source differentiator 150 (FIGS. 2-4) includes a current-to-voltage converter in the form of a resistor load R2 connected between node N1 and ground to thereby yield an application of infrared sensing voltage $V_{IRS}$ at node N1. Infrared radiation source differentiator 250 further includes a buffer in the form of a comparator op-amp U1 having its non-inverting input (+) connected to node N1 and its inverting input (−) connected its output via a node N2 to thereby yield an application of buffered infrared sensing voltage $V_{BIR}$ at node N2.

Infrared radiation source differentiator 250 further includes a band-pass filter in the form of a resistor R3 connected to node N2 and a node N3, a capacitor C1 connected to node N3 and a node N6, a capacitor C2 connected to node N3 and a node N4, a resistor R4 connected to node N4 and a node N5, a capacitor C3 connected to node N2 and node N5, and a resistor R5 connected to node N5 and node N6 to thereby yield an application of filtered infrared sensing voltage $V_{FIR}$ at node N6.

Infrared radiation source differentiator 250 further includes a comparator in the form of a comparator op amp U2 having its non-inverting input (+) connected to node N6 and its inverting input (−) connected to a reference voltage $V_{REF}$ to thereby yield an application of navigation mode voltage $V_{NM}$ at its output.

In operation, the electric resistivity of resistors R2-R5, the capacitance of capacitors C1-C3 and reference voltage $V_{REF}$ are designed to yield an emission by comparative op-amp U2 of navigation mode voltage $V_{NM}$ as navigation enabling mode signal $V_{NEM}$ in response to a sensing by photodiode 241 of the navigation infrared radiation pulses emitted by light emitting diode 231 as reflected by a navigation object (e.g., navigation object 20 shown in FIGS. 1 and 2). Conversely, the electric resistivity of resistors R2-R5, the capacitance of capacitors C1-C3 and reference voltage $V_{REF}$ are designed to yield an emission by comparative op-amp U2 of navigation mode voltage $V_{NM}$ as navigation disabling mode signal $V_{NDM}$ in response to a sensing by photodiode 241 of the ambient infrared radiation pulses within sunlight emitted by the sun.

Similarly, the electric resistivity of resistors R2-R5, the capacitance of capacitors C1-C3 and reference voltage $V_{REF}$ are designed to yield an emission by comparative op-amp U2 of navigation mode voltage $V_{NM}$ as navigation disabling mode signal $V_{NDM}$ in response to a sensing by photodiode 241 of the ambient infrared radiation data pulses from an infrared communication device (e.g., device 22 shown in FIGS. 1 and 4). Additionally, the electric resistivity of resistors R2-R5, the capacitance of capacitors C1-C3 and reference voltage $V_{REF}$ can be designed to yield an emission of navigation mode voltage $V_{NM}$ by comparative op-amp U2 as navigation disabling mode signal $V_{NDM}$ in response to a sensing by photodiode 241 of any other emission source of ambient infrared radiation as would be appreciated by those having ordinary skill in the art.

Figure 6:
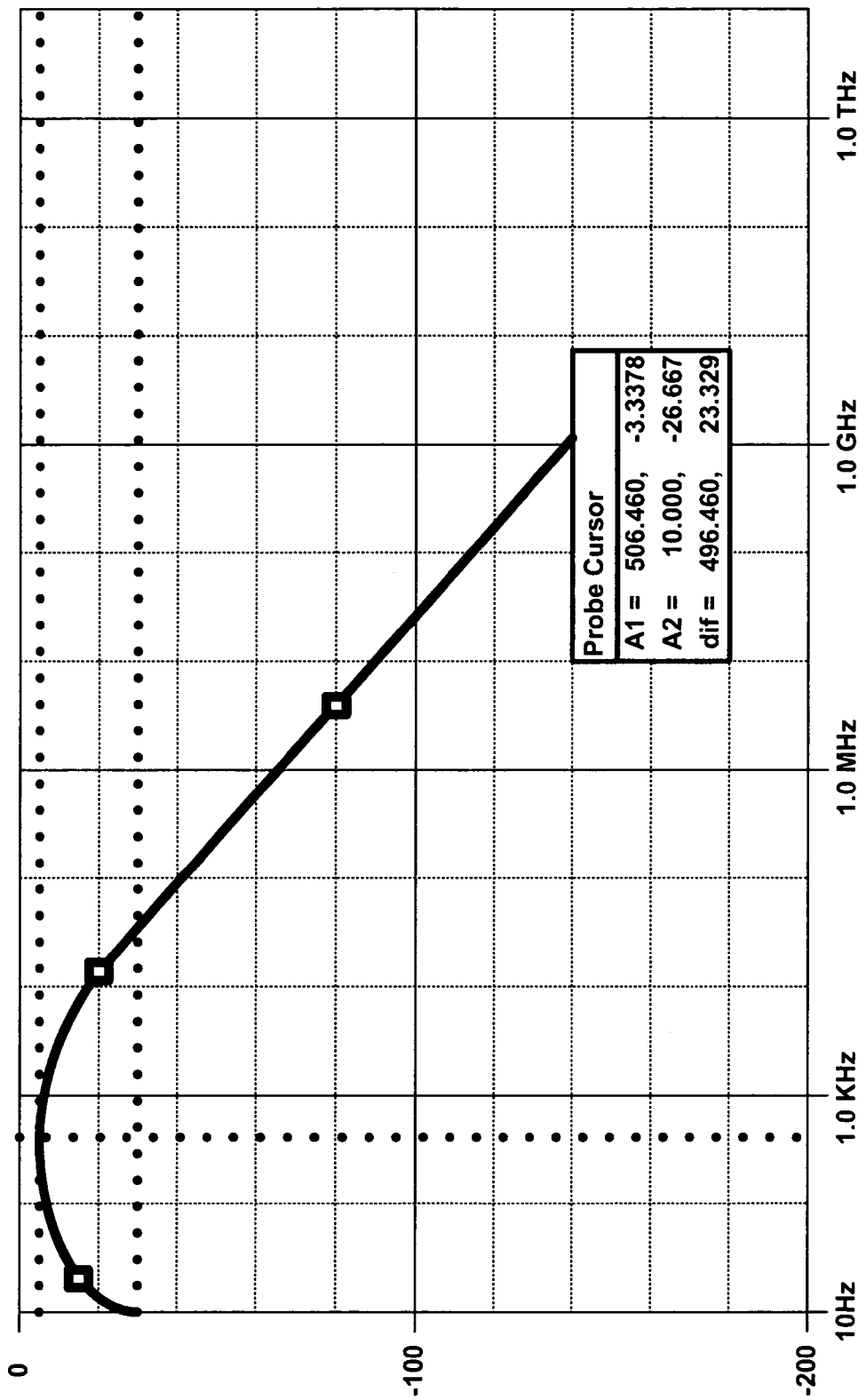
FIG. 6 illustrates an exemplary frequency characteristic of a band-pass filter illustrated in FIG. 5.

To facilitate a further understanding of the present invention, FIG. 5 will now be described in the context of resistor R2 being 100 kΩ, resistors R3 and R5 being 2.0 kΩ, resistor R4 being 2.7 kΩ, capacitors C1 and C3 being 0.1 µf, capacitor C2 being 0.2 µf, comparators U1 and U2 being AD820/AD op-amps and reference voltage being 1 volt. In this context, as shown in FIG. 6, the bypass filter exhibits a peak frequency of 500 Hz that is identical to the pulsing frequency of source 143, cut-off frequencies of 132 Hz and 2.34 kHz at −3 db, and cut-off frequencies of 81 Hz and 4.04 kHz at −6 db.

FIG. 7 illustrates a table listing six (6) basic operational scenarios for facilitating a further understanding of the present invention as illustrated in FIG. 5. Referring to FIGS. 5 and 7, a first scenario involves a sensing mode of the FIG. 5 system being powered off whereby photodiode 241 is inoperable to sense any type of infrared radiation. The result is a low logic state $V_{LL}$ for the navigation mode voltage $V_{NM}$.

The second and third scenarios involve a sensing mode of the FIG. 5 system being powered on whereby photodiode 241 is operable to sense navigation infrared radiation pulses being emitted by light emitting diode 231 with a 100 µs pulse width for a 2 ms period as reflected by a navigation object to photodiode 241. The second scenario further involves photodiode 241 emitting infrared sensed current $I_{IRS}$ with pulses at 2 µA with a 100 µs pulse width for a 2 ms period, and the third scenario further involves photodiode 241 emitting infrared sensed current $I_{IRS}$ with pulses at 35 µA with a 100 µs pulse width for a 2 ms period. This is due to a continuous filter passing of a pulsing buffered infrared sensing voltage $V_{BIR}$ that is continually compared to reference voltage $V_{REF}$. In either case, result is an emission by comparator U2 of navigation mode voltage $V_{NM}$ with pulses at $V_{LH}$-$V_{LL}$ with a 100 µs pulse width for a 2 ms period. Those having ordinary skill in the art will appreciate the differential in the infrared sensed current $I_{IRS}$ between the second scenario and the third scenario is a function of the sensing of the reflection by the navigation object of the navigation infrared radiation pulses being emitted by light emitted diode 231 being stronger in the third scenario as opposed to the second scenario. Those having ordinary skill in the art will appreciate the pulse amplitude of the infrared sensed current $I_{IRS}$ can be indicative of how close the navigation object is to light emitting diode 231 and photodiode 241.

The fourth scenario involves a sensing mode of the FIG. 5 system being powered on whereby photodiode 241 is operable to sense ambient infrared radiation within sunlight and emit infrared sensed current $I_{IRS}$ at 35 µA as indication of the sensing of the ambient infrared radiation within sunlight. The result is an emission by comparator U2 of navigation mode voltage $V_{NM}$ with a single pulse at $V_{LH}$-$V_{LL}$ due to the an initial filter passing of a ramping buffered infrared sensing voltage $V_{BIR}$ that is compared to reference voltage $V_{REF}$ and a subsequent filter blocking of the ramping buffered infrared sensing voltage $V_{BIR}$ as would be appreciated by those having ordinary skill in the art.

The fifth scenario involves a sensing mode of the FIG. 5 system being powered on whereby photodiode 241 is operable to sense ambient infrared radiation pulses within sunlight as well as ambient infrared radiation data pulses from an infrared communication device at 100 µA with a 1.6 µs pulse width for a 8.7 ms period whereby photodiode 241 emits infrared sensed current $I_{IRS}$ consisting of 35 µA as indication of the sensing by photodiode 241 of the ambient infrared radiation within sunlight and pulses at 100 µA with a 1.6 µs pulse width for a 8.7 ms period as an indication of the sensing by photodiode 241 of the ambient infrared radiation data pulses. Again, the result is an emission by comparator U2 of navigation mode voltage $V_{NM}$ with a single pulse at $V_{LH}$-$V_{LL}$ due an initial filter passing of a ramping buffered infrared sensing voltage $V_{BIR}$ that is compared to reference voltage $V_{REF}$ and a subsequent filter blocking of the ramping buffered infrared sensing voltage $V_{BIR}$ as would be appreciated by those having ordinary skill in the art.

The sixth scenario involves a sensing mode of the FIG. 5 system being powered on whereby photodiode 241 is operable to sense ambient infrared radiation data pulses from an infrared communication device at 100 µA with a 1.6 µs pulse width for a 8.7 ms period whereby photodiode 241 emits infrared sensed current $I_{IRS}$ with pulses at 100 µA with a 1.6 µs pulse width for a 8.7 ms period as an indication of the ambient infrared radiation data pulses. The result is an emission by comparator U2 of navigation mode voltage $V_{NM}$ at a voltage logic low $V_{LL}$ due to a filter blocking of the buffered infrared sensing voltage $V_{BIR}$ as would be appreciated by those having ordinary skill in the art.

The aforementioned basic operational scenarios help to serve as a platform to simulate more complex operational scenarios as exemplary shown in FIGS. 8-13.

Figure 8:
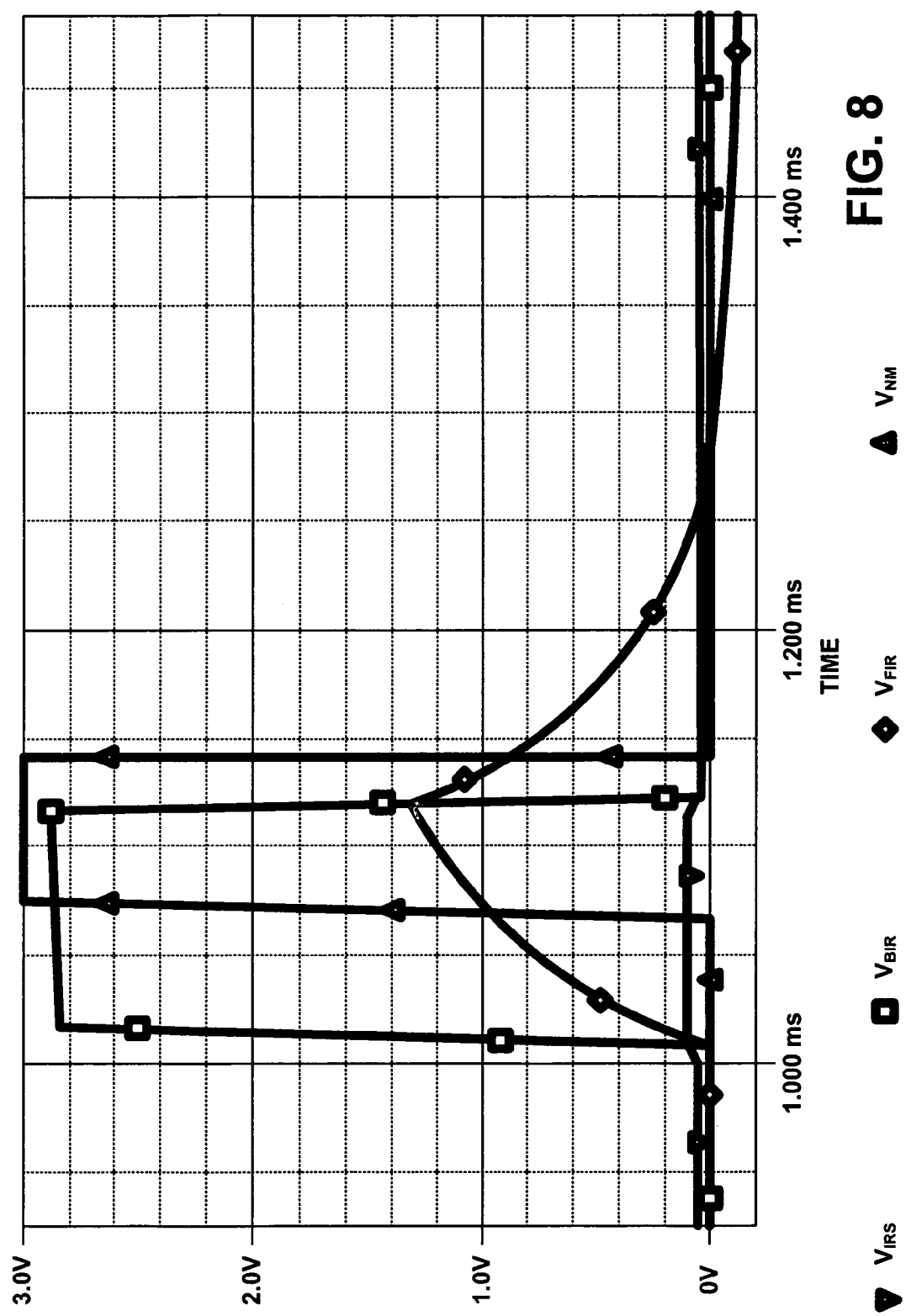
FIGS. 8-13 illustrates exemplary graphs of various voltage signals for the proximity sensor illustrated in FIG. 5 as operated in accordance with the table illustrated in FIG. 7.

Specifically, FIG. 8 illustrates an exemplary simulation of infrared sensing voltage $V_{IRS}$, buffered infrared sensed voltage $V_{BIR}$, filtered infrared sensed voltage $V_{FIR}$, and navigation mode voltage $V_{NM}$ derived from the second and third scenarios listed in the table of FIG. 7. In this scenario, photodiode 241 is additionally sensing a small degree of ambient infrared radiation within the sunlight that increases infrared sensing current by an 0.5 µA that has no significant effect on the pulsing of buffered infrared sensed voltage $V_{BIR}$ and navigation mode voltage $V_{NM}$ in accordance with the insignificant pulsing of the infrared sensing voltage $V_{IRS}$.

Figure 9:
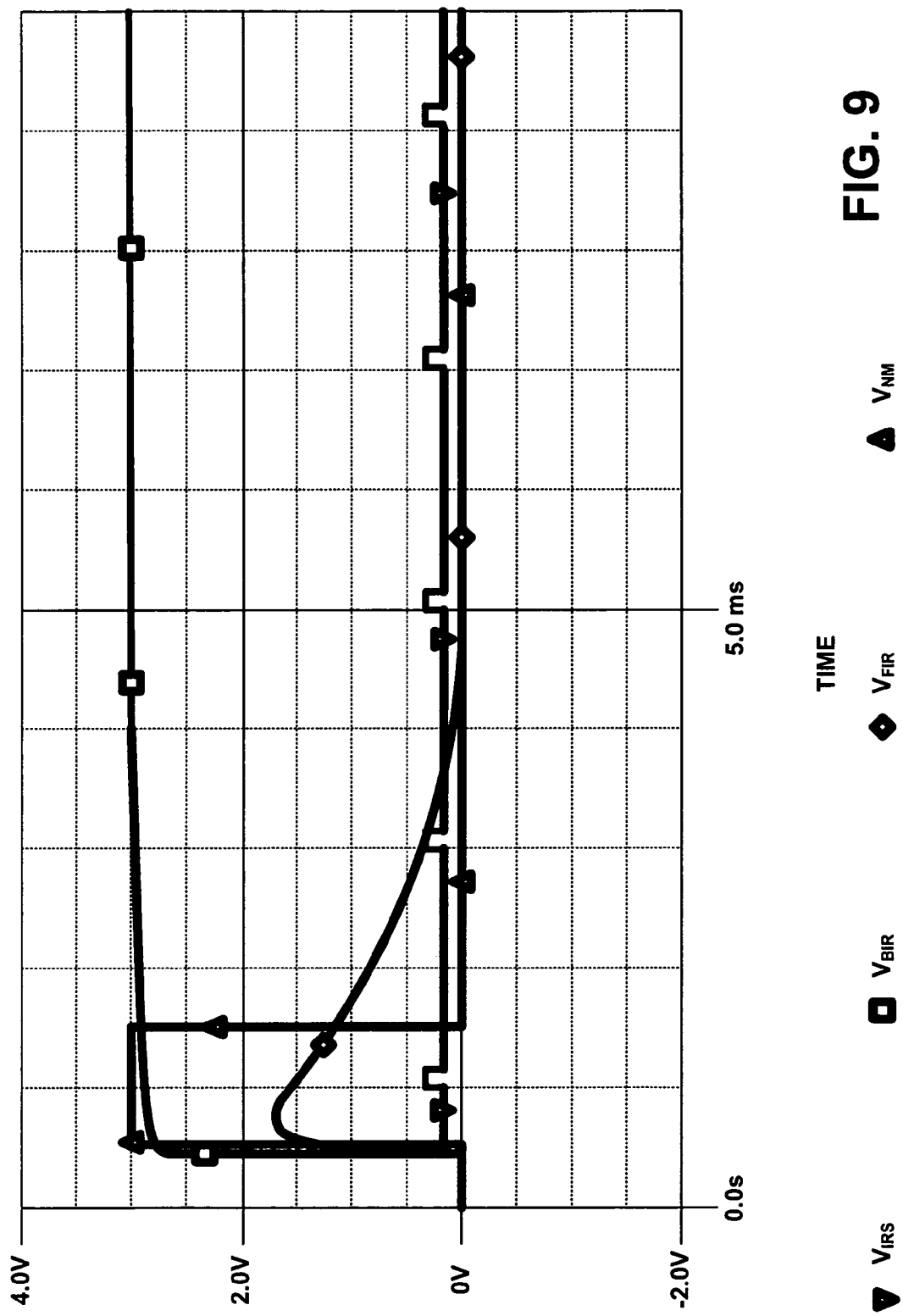

FIG. 9 illustrates an exemplary simulation of infrared sensing voltage $V_{IRS}$, buffered infrared sensed voltage $V_{BIR}$, filtered infrared sensed voltage $V_{FIR}$, and navigation mode voltage $V_{NM}$ derived from the second, third and fourth scenarios listed in the table of FIG. 7. In this scenario, photodiode 241 is sensing a large degree of ambient infrared radiation within the sunlight 0.5 ms prior to sensing the reflected navigation infrared radiation from light emitting diode 231 whereby infrared sensing current $I_{IRS}$ is increased by 1.5 µA. This 1.5 µA increase prevents a pulsing of buffered infrared sensed voltage $V_{BIR}$ and navigation mode voltage $V_{NM}$ in accordance with the pulsing of the infrared sensing voltage $V_{IRS}$. As shown, buffered infrared sensed voltage $V_{BIR}$ and navigation mode voltage $V_{NM}$ will only be pulsed one time whereby the band-pass filter will be completely discharged within 5 ms of buffered infrared sensed voltage $V_{BIR}$ reaching its peak ramp voltage.

Figure 10:
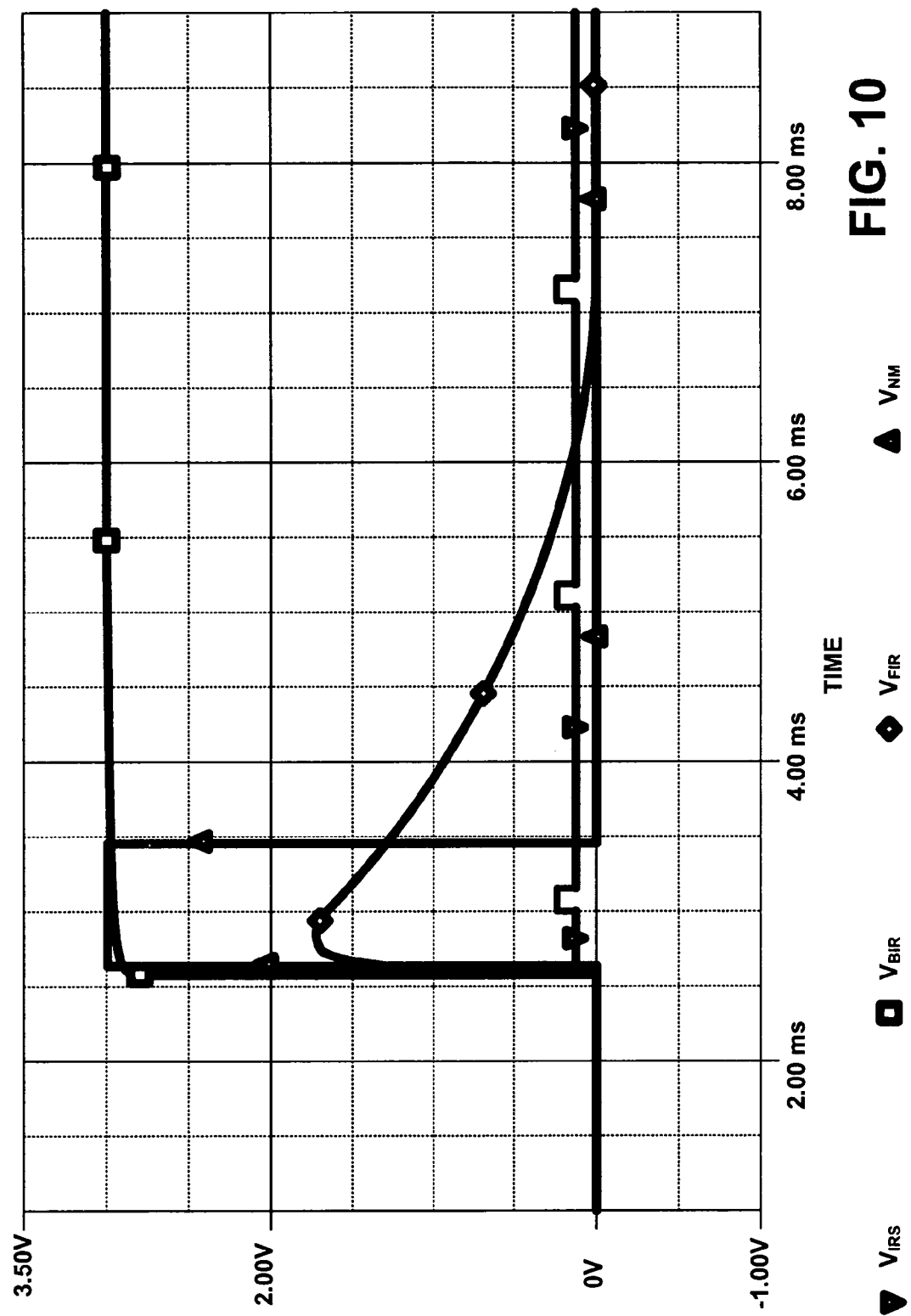

FIG. 10 illustrates an exemplary simulation of infrared sensing voltage $V_{IRS}$, buffered infrared sensed voltage $V_{BIR}$, filtered infrared sensed voltage $V_{FIR}$, and navigation mode voltage $V_{NM}$ also derived from the second, third and fourth scenarios listed in the table of FIG. 7. In this scenario, photodiode 241 is additionally sensing a large degree of ambient infrared radiation within the sunlight 0.5 ms after sensing the reflected navigation infrared radiation from light emitting diode 231. Again, this 1.5 µA increase prevents a pulsing of buffered infrared sensed voltage $V_{BIR}$ and navigation mode voltage $V_{NM}$ in accordance with the pulsing of the infrared sensing voltage $V_{IRS}$. As shown, buffered infrared sensed voltage $V_{BIR}$ and navigation mode voltage $V_{NM}$ will only be pulsed one time whereby the band-pass filter will be completely discharged within 5 ms of buffered infrared sensed voltage $V_{BIR}$ reaching its peak ramp voltage.

Figure 11:
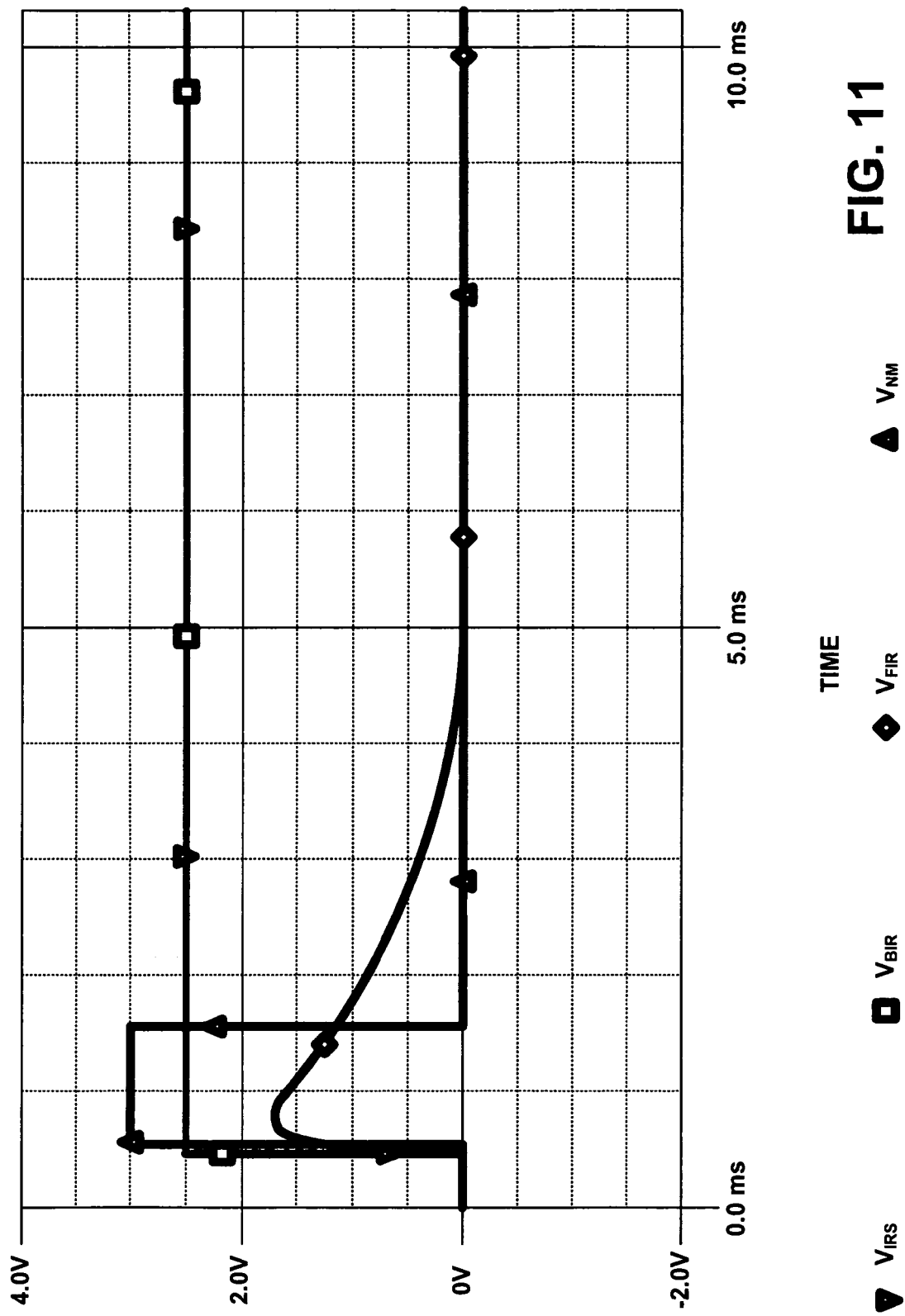

FIG. 11 illustrates an exemplary simulation of infrared sensing voltage $V_{IRS}$, buffered infrared sensed voltage $V_{BIR}$, filtered infrared sensed voltage $V_{FIR}$, and navigation mode voltage $V_{NM}$ also derived from the second, third and fourth scenarios listed in the table of FIG. 7. In this scenario, photodiode 241 is sensing an even larger degree of ambient infrared radiation within the sunlight 0.5 ms prior to sensing the reflected navigation infrared radiation from light emitting diode 231 whereby infrared sensing current $I_{IRS}$ is increased by 40 µA. This 40 µA increase prevents a continual pulsing of buffered infrared sensed voltage $V_{BIR}$ and navigation mode voltage $V_{NM}$ in accordance with the pulsing of the infrared sensing voltage $V_{IRS}$. As shown, buffered infrared sensed voltage $V_{BIR}$ and navigation mode voltage $V_{NM}$ will be pulsed twice whereby the band-pass filter will be completely discharged within 5 ms of buffered infrared sensed voltage $V_{BIR}$ reaching its peak ramp voltage.

Figure 12:
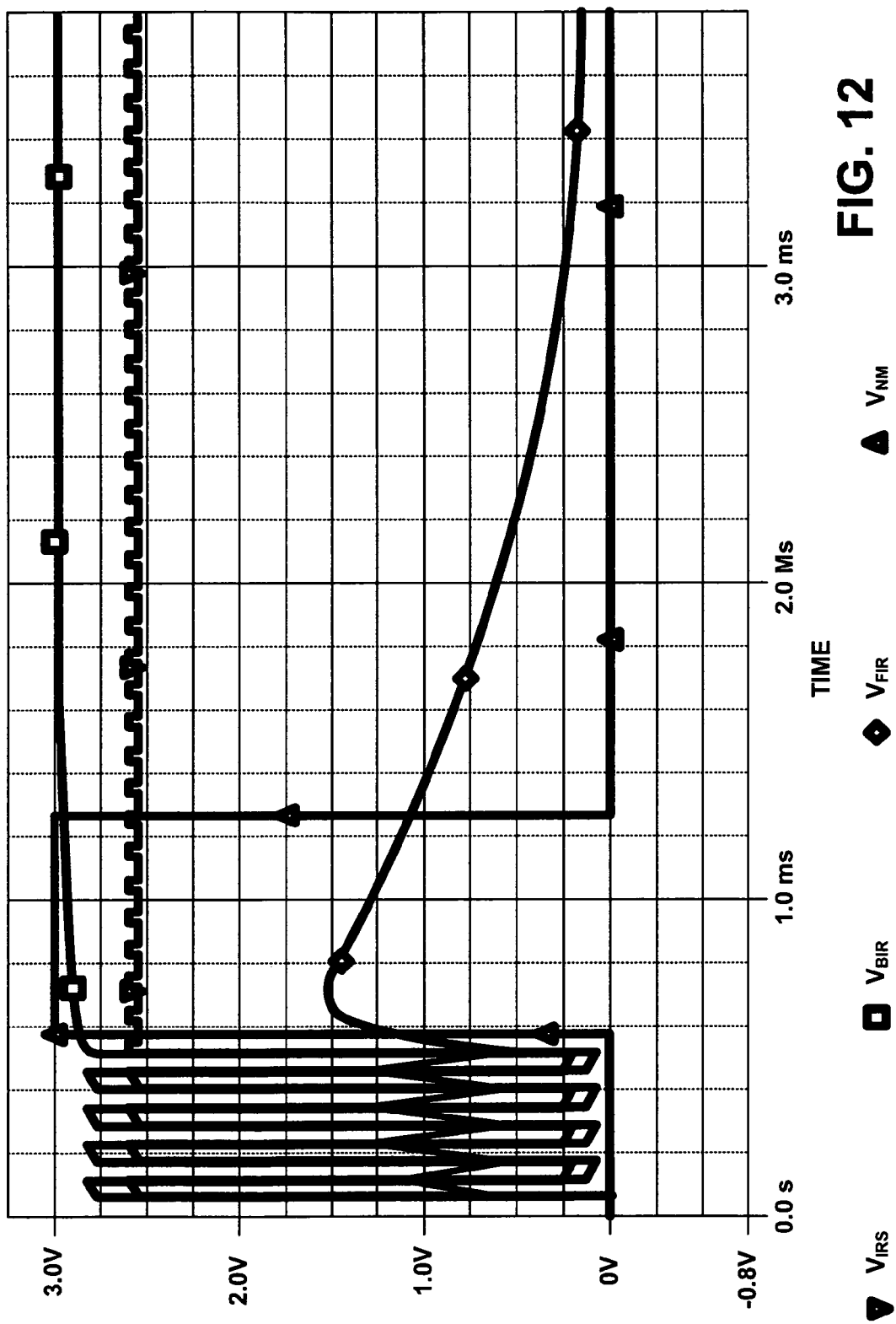

FIG. 12 illustrates an exemplary simulation of infrared sensing voltage $V_{IRS}$, buffered infrared sensed voltage $V_{BIR}$, filtered infrared sensed voltage $V_{FIR}$, and navigation mode voltage $V_{NM}$ also derived from the fifth and sixth scenarios listed in the table of FIG. 7. In this scenario, photodiode 241 sense a large degree of ambient infrared radiation within the sunlight 0.5 ms prior to sensing ambient infrared radiation data pulses from an infrared communication device whereby infrared sensing current $I_{IRS}$ is ramped to 40 µA. As shown, the sensing of the ambient infrared radiation data pulses prior to the sensing of the ambient infrared radiation within sunlight prevented any pulsing of buffered infrared sensed voltage $V_{BIR}$ and navigation mode voltage $V_{NM}$. Buffered infrared sensed voltage $V_{BIR}$ and navigation mode voltage $V_{NM}$ are nonetheless pulsed once upon a sensing of the infrared radiation within the sunlight whereby the band-pass filter completely discharges within 5 ms of buffered infrared sensed voltage $V_{BIR}$ reaching its peak ramp voltage.

Figure 13:
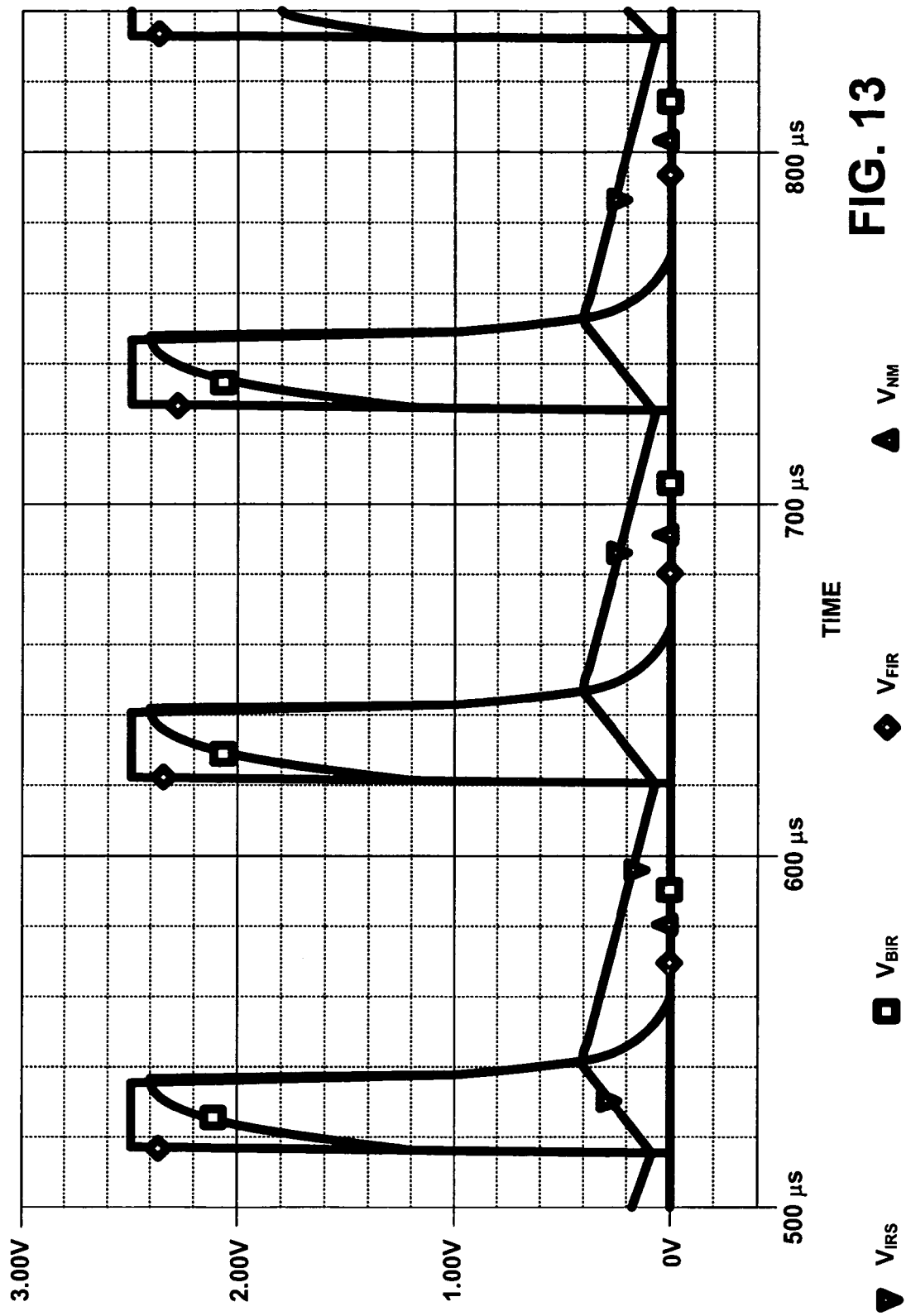

FIG. 13 illustrates an exemplary simulation of infrared sensing voltage $V_{IRS}$, buffered infrared sensed voltage $V_{BIR}$, filtered infrared sensed voltage $V_{FIR}$, and navigation mode voltage $V_{NM}$ derived from the sixth scenario listed in the table of FIG. 7. In this scenario, photodiode 241 senses infrared radiation data pulses from an infrared communication device whereby infrared sensing current $I_{IRS}$ is pulses at 40 μA with a 20 μs pulse within 104 μs with an insignificant amount of ambient infrared radiation within sunlight being sensed by photodiode 241. As shown, the sensing of the ambient infrared radiation data pulses without any significant sensing of infrared radiation within sunlight prevents any pulsing of buffered infrared sensed voltage $V_{BIR}$ and navigation mode voltage $V_{NM}$.

From the description herein of FIGS. 1-13, those having ordinary skill in the art will appreciate the numerous advantages of a graphical user interface navigation system of the present invention within a graphical user interface based display device of any type (e.g., a hand phone, a personal data assistant and the like). Specifically, a graphical user interface navigation system of the present invention can include an X number of infrared radiation emitters 30 (FIG. 1), a Y number of infrared radiation sensors 40 (FIG. 1) and a Z number of infrared radiation source differentiators 50 (FIG. 1), where $X \geq 1$, $Y \geq 1$, $Z \geq 1$, $Y \geq X$, and $Y \geq Z$. Each infrared radiation sensor 40 is designated with a navigation direction, such as for, example, up, down, left, right, up-left, up-right, down-left and down-right. Each infrared radiation source differentiator 50 includes a N number of infrared radiation sensor inputs and a M number of navigation mode outputs, wherein $N \leq Y$ and $M \leq Y$.

For example, assuming eight (8) infrared radiation sensors 40, a single infrared radiation source differentiator 50 can input infrared sensing signals from all eight (8) infrared radiation sensors 40 and output eight (8) or fewer navigation mode signals. In the case of seven (7) or fewer navigation mode signals, the infrared navigation source differentiator 50 can employ logic circuitry that logically mixes the eight (8) inputted infrared sensing signals, eight (8) or fewer buffered infrared sensing signals, eight (8) or fewer filtered infrared sensing signals or the resulting eight (8) or fewer navigation mode signals in a pre-scribed manner that retains, if not enhances, the source differentiation functions of the infrared navigation source differentiator 50.

Figure 14:
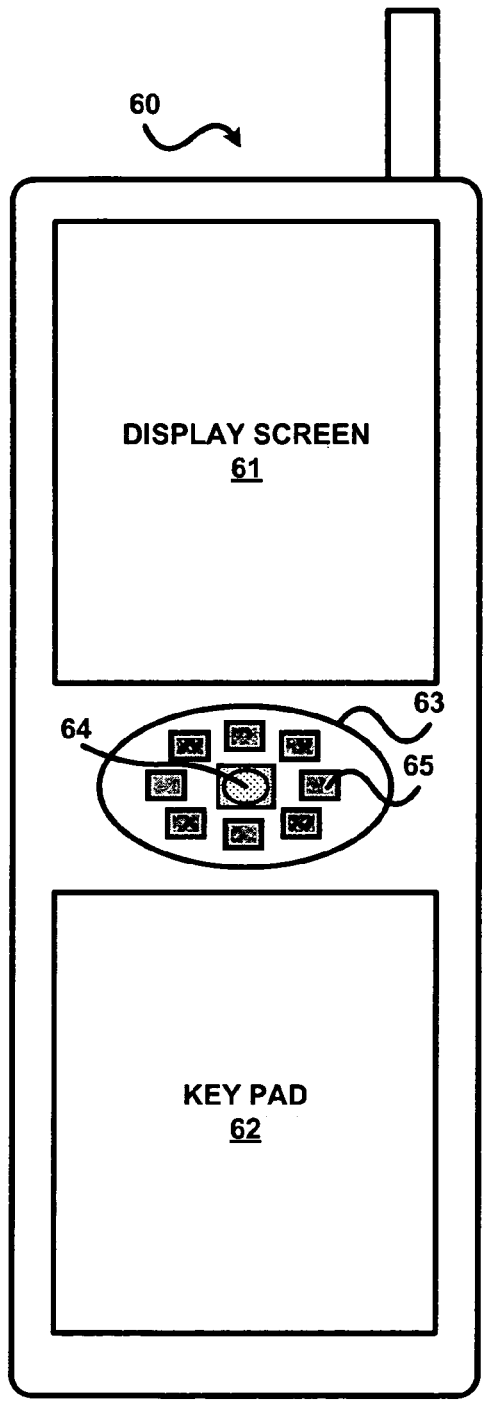
FIGS. 14 and 15 illustrates a side view an a front view, respectively, of a telecommunication device in accordance with the present invention.
Figure 15:
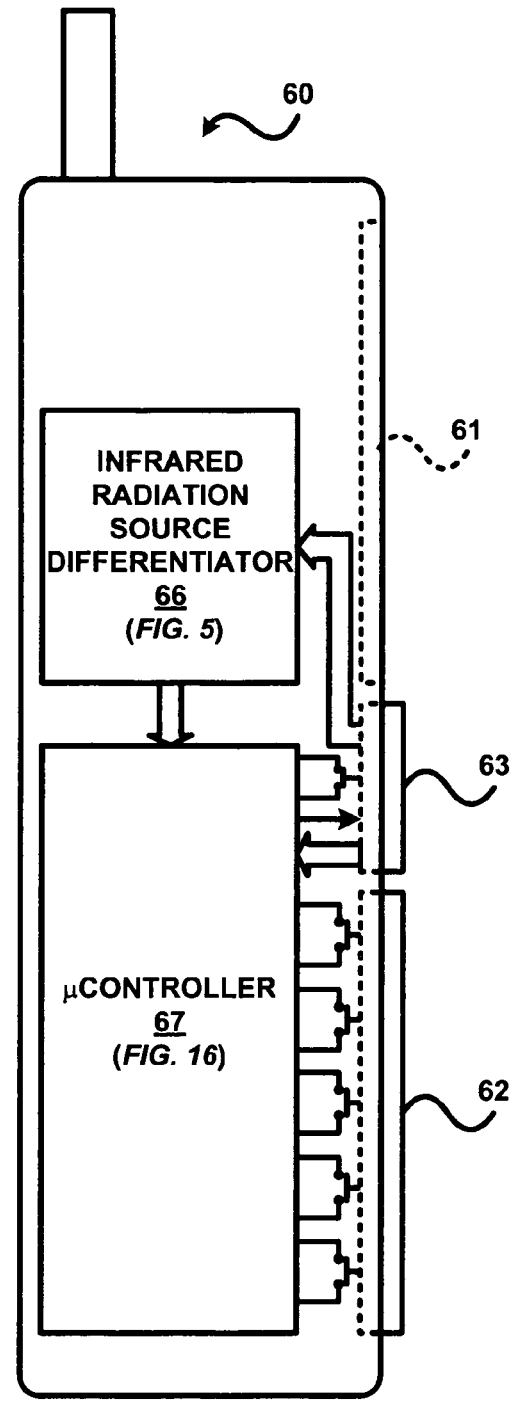

The following description of one embodiment of a handheld phone incorporating a graphical user interface navigation system of the present invention as shown in FIGS. 14 and 15 therefore does not limit or restrict the scope of structural configurations of a graphical user interface navigation system of the present invention and does not limit or restrict the types of display devices applicable to the present invention Referring to FIGS. 14 and 15, a hand-held phone 60 employs a display screen 61, a key pad 62 and a graphical user interface navigation system of the present invention employing a navigation button 63 and a proximity sensor including a light emitting diode 64, eight (8) photodiodes 65, an infrared radiation source differentiator 66 and a microcontroller 67. Key pad 62 and navigation button 63 are mechanically coupled to microcontroller 67 via push switches as shown. An internal view of navigation button 63 is shown in FIG. 14 as having light emitting diode 64 and the photodiodes 65 strategically positioned around light emitting diode 64, which is shielded to prevent any crosstalk between light emitting diode 64 and the photodiodes 65. Externally, navigation button 63 will have a cap (not shown) that graphically shows an up arrow, a down arrow, a right arrow and a left arrow to facilitate a manipulation of navigation button 63.

Microcontroller 67 controls a pulsating emission of infrared radiation pulses by light emitting diode 64 in the plurality of arrow directions of the navigation button 63, and photodiodes 65 collectively provide eight (8) infrared sensing signals to both infrared radiation source differentiator 66 and microcontroller 67. In turn, infrared radiation source differentiator 66 provides eight (8) navigation mode signals to microcontroller 67 whereby microcontroller 67 processes the eight (8) navigation mode signals to determine whether or not to navigate a graphical user interface displayed on display screen 61 in accordance with the eight (8) infrared sensing signals received by microcontroller 67 from photodiodes 65. To this end, microcontroller 67 implements a method for ascertaining when the eight (8) navigation mode signals are collectively indicating the need to navigate a graphical user interface displayed on display screen 61 in accordance with the eight (8) infrared sensing signals received by microcontroller 67 from photodiodes 65. This is particular important in view of the random natures of a transitioning between an enabling indication and a disabling indication by each of the eight (8) navigation mode signals from infrared radiation source differentiator 66.

Figure 16:
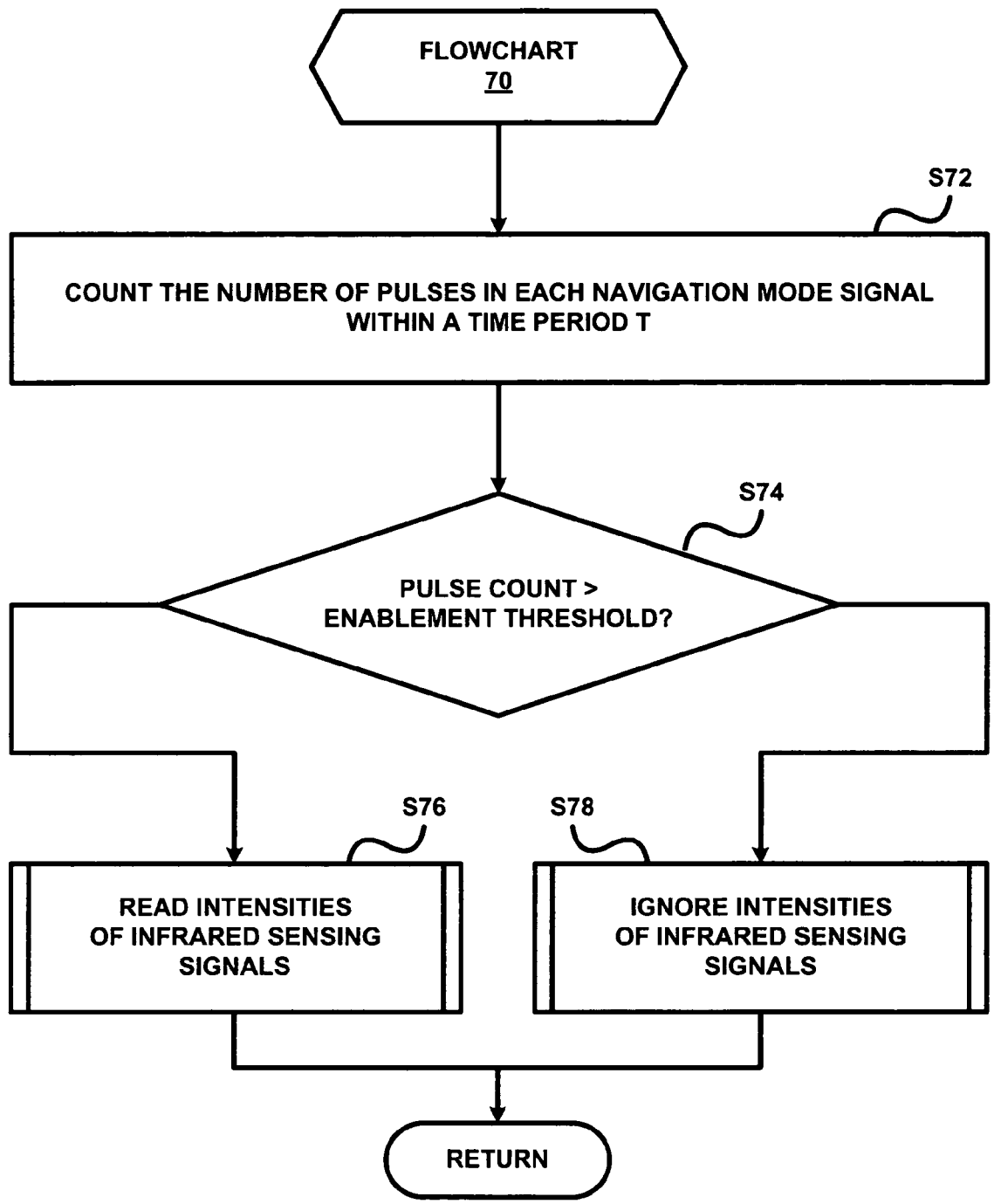
FIG. 16 illustrates a flowchart representative of an operational mode determination method in accordance with the present invention.

FIG. 16 illustrates a flowchart 70 indicative of one embodiment of an operational mode determination method in accordance with the present invention. A stage S72 of flowchart 70 encompasses microcontroller 67 counting the number of pulses in each of the eight (8) navigation mode signals received from infrared radiation source differentiator 66 within a time period T, and a stage S74 of flowchart 70 encompasses microcontroller 67 comparing a pulse count to an enablement threshold. In one embodiment, stage S74 is performed on a total count basis of all pulses among the navigation mode signals whereby microcontroller 67 proceeds to a stage S76 of flowchart 70 to read in intensities of the eight (8) infrared sensing signals if the total count basis exceeds the enablement threshold. Otherwise, microcontroller 67 proceeds to a stage S76 of flowchart 70 to ignore the intensities of the eight (8) infrared sensing signals if the total count basis fails to exceed the enablement threshold.

In a second embodiment, stage S74 is performed on an individual basis for each navigation mode signal whereby microcontroller 67 proceeds to stage S76 of flowchart 70 to read in intensities of the eight (8) infrared sensing signals if a certain percentage of the individual pulse counts exceeds the enablement threshold. Otherwise, microcontroller 67 proceeds to a stage S76 of flowchart 70 to ignore the intensities of the eight (8) infrared sensing signals if a certain percentage of the individual pulse counts fails to exceed the enablement threshold.

Microcontroller 67 will thereafter return to stage S72 to repeat flowchart 70 for a new time period T having on offset from the previous time period T. In one embodiment, the offset is a multiple of the pulsing frequency of the infrared radiation emitted by light emitting diode 64.

Referring to FIGS. 14-16, those having ordinary skill in the art will appreciate how to apply the inventive principles of the an operational mode determination method of the present invention as represented by flowchart 70 in dependence upon the X number of infrared radiation emitters 30, the Y number of infrared radiation sensors 40 and the Z number of infrared radiation source differentiators 50 employed per navigation button and in dependence the N number of infrared radiation sensor inputs and a M number of navigation mode outputs per infrared radiation source differentiator 50.

While the embodiments of the invention disclosed herein are presently considered to be preferred, various changes and modifications can be made without departing from the scope of the invention. The scope of the invention is indicated in the appended claims and all changes that come within the meaning and range of equivalents are intended to be embraced therein.

We claim:

1. A proximity sensor for facilitating an operation of a graphical user interface navigation button, the proximity sensor comprising:
   an infrared radiation emitter operable to emit a navigation infrared radiation;
   an infrared radiation sensor positioned relative to the infrared radiation emitter to sense a reflection of the navigation infrared radiation off of a navigation object proximate the infrared radiation emitter and the infrared radiation sensor, wherein the infrared radiation sensor corresponds to a specific navigation direction of movement on a graphical user interface; and
   an infrared radiation source differentiator in electrical communication with the infrared radiation sensor, the infrared radiation source differentiator to:
      generate a first infrared sensing signal in response to sensing the reflection of the navigation infrared signal from the infrared radiation emitter;
      generate a second infrared sensing signal in response to sensing ambient infrared radiation emitted by an infrared radiation source other than the infrared radiation emitter; and
      provide a navigation mode signal indicative of at least the first infrared sensing signal;
   wherein the operation of the graphical user interface navigation button is facilitated by the proximity sensor in response to the navigation mode signal indicating at least a sensing by the infrared radiation sensor of the reflection of the navigation infrared radiation in the navigation direction corresponding to the infrared radiation sensor.

2. The proximity sensor of claim 1, wherein the infrared radiation emitter includes:
   a pulse generator operable to provide a pulsing signal at a pulsing frequency; and
   a light emitting diode operable to emit the navigation infrared radiation as pulses at the pulsing frequency in response to an electrical communication of the pulsing signal to the light emitting diode by the pulse generator.

3. The proximity sensor of claim 2, wherein the infrared radiation sensor includes:
   a photodiode operable to emit an infrared radiation sensing current indicative of at least one of a degree of the proximity of the navigation object to the light emitting diode and the photodiode in response to the navigation object reflecting the navigation infrared radiation in the navigation direction corresponding to the infrared radiation sensor.

4. The proximity sensor of claim 3, wherein the infrared radiation source differentiator includes:
   a current-to-voltage converter operable to convert the infrared radiation sensing current to an infrared radiation sensing voltage; and
   a buffer operable to buffer the infrared radiation sensing voltage.

5. The proximity sensor of claim 4, wherein the infrared radiation source differentiator further includes:
   a bandpass filter operable to apply a bandpass filtering to the buffered infrared radiation sensing voltage in response to an electrical communication of the buffered infrared radiation sensing voltage to the bandpass filter from the buffer.

6. The proximity sensor of claim 5, wherein the infrared radiation source differentiator further includes:
   a comparator operable to generate the navigation mode signal based on a comparison of the bandpass filtering to the buffered infrared radiation sensing voltage and a reference threshold.

7. The proximity sensor of claim 1,
   wherein a number of pulses of the navigation mode signal within a pre-determined time period exceeding an enablement threshold is indicative of the sensing by the infrared radiation sensor of a reflection of the navigation infrared radiation in the navigation direction corresponding to the infrared radiation sensor by a navigation object proximate the infrared radiation emitter and the infrared radiation sensor; and
   wherein a number of pulses of the navigation mode signal within the pre-determined time period being less than the enablement threshold indicates the sensing by the infrared radiation sensor of ambient infrared radiation emitted by an infrared radiation source other than the infrared radiation sensor.

8. A graphical user interface navigation system, comprising:
   a graphical user interface navigation button; and
   a proximity sensor for operating the graphical user interface navigation button, the proximity sensor including:
      an infrared radiation emitter operable to emit a navigation infrared radiation;
      an infrared radiation sensor positioned relative to the infrared radiation emitter to sense a reflection of the navigation infrared radiation off of a navigation object proximate the infrared radiation emitter and the infrared radiation sensor, wherein the infrared radiation sensor corresponds to a specific navigation direction of movement on a graphical user interface; and
      an infrared radiation source differentiator in electrical communication with the infrared radiation sensor, the infrared radiation source differentiator to:
         generate a first infrared sensing signal in response to sensing the reflection of the navigation infrared signal from the infrared radiation emitter;
         generate a second infrared sensing signal in response to sensing ambient infrared radiation emitted by an infrared radiation source other than the infrared radiation emitter; and
         provide a navigation mode signal indicative of at least the first infrared sensing signal;
   wherein the operation of the graphical user interface navigation button is facilitated by the proximity sensor in response to the navigation mode signal indicating at least a sensing by the infrared radiation sensor of the reflection of the navigation infrared radiation in the navigation direction corresponding to the infrared radiation sensor by the navigation object.

9. The graphical user interface navigation system of claim 8, wherein the infrared radiation emitter includes:
   a pulse generator operable to provide a pulsing signal at a pulsing frequency; and
   a light emitting diode operable to emit the navigation infrared radiation as pulses at the pulsing frequency in response to an electrical communication of the pulsing signal to the light emitting diode by the pulse generator.

10. The graphical user interface navigation system of claim 9, wherein the infrared radiation sensor includes:
   a photodiode operable to emit an infrared radiation sensing current indicative of a degree of the proximity of the navigation button to the light emitting diode and the photodiode in response to the navigation button reflecting the navigation infrared radiation in the navigation direction corresponding to the infrared radiation sensor.

11. The graphical user interface navigation system of claim 10, wherein the infrared radiation source differentiator includes:
a current-to-voltage converter operable to convert the infrared radiation sensing current to an infrared radiation sensing voltage; and
a buffer operable to buffer the infrared radiation sensing voltage.

12. The graphical user interface navigation system of claim 11, wherein the infrared radiation source differentiator further includes:
a bandpass filter operable to apply a bandpass filtering to the buffered infrared radiation sensing voltage in response to an electrical communication of the buffered infrared radiation sensing voltage to the bandpass filter from the buffer.

13. The graphical user interface navigation system of claim 12, wherein the infrared radiation source differentiator further includes:
a comparator operable to generate the navigation mode signal based on a comparison of the bandpass filtering to the buffered infrared radiation sensing voltage and a reference threshold.

14. The graphical user interface navigation system of claim 8,
wherein a number of pulses of the navigation mode signal within a pre-determined time period exceeding an enablement threshold is indicative of the sensing by the infrared radiation sensor of a reflection of the navigation infrared radiation in the navigation direction corresponding to the infrared radiation sensor by a navigation object proximate the infrared radiation emitter and the infrared radiation sensor; and
wherein the number of pulses of the navigation mode signal within the pre-determined time period being less than the enablement threshold indicates the sensing by the infrared radiation sensor of ambient infrared radiation emitted by an infrared radiation source other than the infrared radiation sensor.

15. A display device, comprising:
a display screen for displaying a graphical user interface;
a graphical user interface navigation button to facilitate a navigation of the graphical user interface by a user of the display device and a proximity sensor a proximity sensor for operating the graphical user interface navigation button, the proximity sensor including:
an infrared radiation emitter operable to emit a navigation infrared radiation;
an infrared radiation sensor positioned relative to the infrared radiation emitter to sense a reflection of the navigation infrared radiation off of a navigation object proximate the infrared radiation emitter and the infrared radiation sensor, wherein the infrared radiation sensor corresponds to a specific navigation direction of movement on the graphical user interface; and
an infrared radiation source differentiator in electrical communication with the infrared radiation sensor, the infrared radiation source differentiator to:
generate a first infrared sensing signal in response to sensing the reflection of the navigation infrared signal from the infrared radiation emitter;
generate a second infrared sensing signal in response to sensing ambient infrared radiation emitted by an infrared radiation source other than the infrared radiation emitter; and
provide a navigation mode signal indicative of at least the first infrared sensing signal;
wherein the operation of the graphical user interface navigation button is facilitated by the proximity sensor in response to the navigation mode signal indicating at least a sensing by the infrared radiation sensor of the reflection of the navigation infrared radiation in the navigation direction corresponding to the infrared radiation sensor by the navigation object.

16. The display device of claim 15, wherein the infrared radiation emitter includes:
a pulse generator operable to provide a pulsing signal at a pulsing frequency; and
a light emitting diode operable to emit the navigation infrared radiation as pulses at the pulsing frequency in response to an electrical communication of the pulsing signal to the light emitting diode by the pulse generator.

17. The display device of claim 16, wherein the infrared radiation sensor includes:
a photodiode operable to emit an infrared radiation sensing current indicative of a degree of the proximity of the navigation button to the light emitting diode and the photodiode in response to the navigation button reflecting the navigation infrared radiation in the navigation direction corresponding to the infrared radiation sensor.

18. The display device of claim 17, wherein the infrared radiation source differentiator includes:
a current-to-voltage converter operable to convert the infrared radiation sensing current to an infrared radiation sensing voltage; and
a buffer operable to buffer the infrared radiation sensing voltage.

19. The display device of claim 18, wherein the infrared radiation source differentiator further includes:
a bandpass filter operable to apply a bandpass filtering to the buffered infrared radiation sensing voltage in response to an electrical communication of the buffered infrared radiation sensing voltage to the bandpass filter from the buffer.

20. The display device of claim 19, wherein the infrared radiation source differentiator further includes:
a comparator operable to generate the navigation mode signal based on a comparison of the bandpass filtering to the buffered infrared radiation sensing voltage and a reference threshold.

21. The graphical user interface navigation system of claim 15,
wherein a number of pulses of the navigation mode signal within a pre-determined time period exceeding an enablement threshold is indicative of the sensing by the infrared radiation sensor of a reflection of the navigation infrared radiation in the navigation direction corresponding to the infrared radiation sensor by a navigation object proximate the infrared radiation emitter and the infrared radiation sensor; and
wherein the number of pulses of the navigation mode signal within the pre-determined time period being less than the enablement threshold indicates the sensing by the infrared radiation sensor of ambient infrared radiation emitted by an infrared radiation source other than the infrared radiation sensor.

* * * * *